United States Patent
Chou

(10) Patent No.: US 7,068,201 B1
(45) Date of Patent: Jun. 27, 2006

(54) DIGITAL-TO-ANALOG CONVERTER

(75) Inventor: Kuo-Yu Chou, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 10/907,861

(22) Filed: Apr. 19, 2005

(30) Foreign Application Priority Data

Jan. 17, 2005 (TW) .............................. 94101266 A

(51) Int. Cl.
*H03M 1/66* (2006.01)
(52) U.S. Cl. ...................... 341/144; 341/145
(58) Field of Classification Search ............... 341/144, 341/136, 120, 145, 154, 118; 323/312, 313
See application file for complete search history.

(56) References Cited

U.S. PATENT DOCUMENTS

| 5,568,145 A | 10/1996 | Reynolds ..................... 341/145 |
| 6,265,857 B1 * | 7/2001 | Demsky et al. ............. 323/312 |
| 6,633,248 B1 * | 10/2003 | Song ........................... 341/144 |
| 6,650,265 B1 * | 11/2003 | Bugeja ....................... 341/144 |
| 6,738,006 B1 * | 5/2004 | Mercer et al. .............. 341/144 |
| 6,844,835 B1 * | 1/2005 | Kao ........................... 341/136 |

\* cited by examiner

*Primary Examiner*—Brian Young
(74) *Attorney, Agent, or Firm*—Jiang Chyun IP Office

(57) ABSTRACT

A digital-to-analog converter (DAC) is disclosed, which provides different bias voltages to the most significant bits (MSBs) and the least significant bits (LSBs) of the digital signal. These two bias voltages can be adjusted according to the match among the current source cells, and maintain a particular proportional relationship. The DAC further includes a bias converter for receiving the first bias voltage, and adjusting the second bias voltage according to the match among the current source cells.

20 Claims, 11 Drawing Sheets

DIGITAL-TO-ANALOG CONVERTER

CROSS-REFERENCE TO RELATED APPLICATION

This application claims the priority benefit of Taiwan application serial no. 94101266, filed on Jan. 17, 2005. All disclosure of the Taiwan application is incorporated herein by reference.

BACKGROUND OF THE INVENTION

1. Field of the Invention

The present invention relates to a digital-to-analog converter (DAC), more particularly, to a digital-to-analog converter providing the MSB (most significant bit) portion and the LSB (least significant bit) portion with different bias voltages, wherein these two bias voltages would be adjusted according to the match of current source cells.

2. Description of the Related Art

The digital-to-analog converter (DAC) has been widely used for data transforming in electronic devices. The DAC mainly converts the digital signals to corresponding analog signals, which are used in electronic devices. The application of the DACs is very wide. The DACs with high resolution and high speed, for example, can be applied to mobile phones or base stations of communication systems, cordless communication networks, image processing and display systems, or audio/video systems, and so on.

A conventional DAC can be, for example, a binary-weighted DAC. Such a DAC comprises various current sources and the corresponding switches. A conventional binary-weighted DAC is shown in FIG. 1A, a schematic circuit block drawing. Wherein, a 3-bit DAC is taken as an example. The 3-bit DAC comprises three current sources 102, 104 and 106, and three corresponding switches S1, S2 and S3. The current source 102 is connected to the switch S1 via the line 112, and passes through the output line 118 for output. The current source 104 is connected to the switch S2 via the line 114, and passes through the output line 118 for output. The current source 106 is connected to the switch S3 via the line 116, and passes through the output line 118 for output. The proportion of currents provided by these three current sources 102, 104 and 106 is 4:2:1. That is, if one amp of current is provided by the current source 106, then the current source 104 and 102 would provide two amps and four amps of current, respectively.

During the operation, an input-code IN controls the turning-on and turning-off of switches S1, S2 and S3 and the corresponding output currents would reach the output end OUT via the line 118. According to such control, the magnitude of the output current is proportional to the value of input code IN. And a conventional output circuit (not shown), such as an operation amplifier, can be connected in series thereto for converting the output current to a corresponding voltage value, or to an output voltage with low impedance. The control circuit for the kind of binary-weighted DAC is simpler.

However, in the above operation, there would be so-called transient glitch which may affect the accuracy of digital-analog conversion. When an input-code IN is changed from 011 (in binary system) to 100, all three switches S1, S2 and S3 will change their status, although only the "1" bit-value is changed. Therefore, the binary-weighted DAC is not suitable for converting the digital signal with large bits, and it doesn't guarantee a non-monotonic function. Referring to FIG. 1B, a schematic coordination diagram of the relationship between input-codes and so-called corresponding differential non-linearity (DNL) errors is shown. For each input-code, major DNL errors would occur from time to time. That is, at two contiguous points of time to convert digital input-codes IN to analog signals, the actual output analog signal value is not an ideal value. The DNL error would affect the accuracy of output in the DAC. What is more, the DNL error will lead to a serious non-monotonic problem. That is, the output analog value converted from a smaller digital input-code is larger than that from a larger digital input-code, leading to serious error. It can be seen from FIG. 1C, during data transformation process, an unpredictable transient glitch could occur.

In other words, if a binary-weighted DAC has more bits, and each received digital bit controls $2^{(n-1)}$ current source cells, where n ranges from 1 to 10, then, transient glitch would be more serious. The DNL error could be caused by characteristic discrepancy among the formed transistors in the array of current source cells. And, the characteristic discrepancy among the formed transistors can be traced back to the inconsistency in semiconductor manufacturing process, such as inconsistent thickness of oxide layer, poor poly-silicon etching, or shift in ion implant, and so on. In addition, the binary-weighted DAC needs a substantial chip layout area as well.

To improve the transient glitch, a DAC with so-called thermometer-code was introduced to control output of current source. Referring to FIG. 2, a schematic circuit drawing of an 8-bit DAC with thermometer-codes is shown. Wherein, the DAC 200 comprises two four-to-fifteen bit converters 210 and 220. The four-to-fifteen bit converter 210 is used for converting the four MSBs (most significant bits) in the input-code IN1, IN2, IN3 and IN4 to the corresponding fifteen pieces of data, M1, M2, M3, . . . , M15 (M1~M15). And, the four-to-fifteen bit converter 220 is used for converting the four LSBs (least significant bits) in the input-code IN5, IN6, IN7 and IN8 to the corresponding fifteen pieces of data, L1, L2, L3, . . . , L15 (L1~L15). These converted data are referred to as thermometer-code outputs. When the above-mentioned input-codes are on the increase, these thermometer-codes can avoid the transient glitch when switching all the switches, and consequently, suddenly changing the currents.

The DAC 200 further comprises fifteen current source cells CSM1~CSM15 corresponding to MSBs and fifteen current source cells CSL1~CSL15 corresponding to LSBs. The current source cells CSM1~CSM15 are connected to the outputs M1~M15 of the four-to-fifteen bit converter 210 via the corresponding switches SWM1~SWM15. And, the current source cells CSL1~CSL15 are connected to the outputs L1~L15 of the four-to-fifteen bit converter 220 via the corresponding switches SWL1~SWL15. The outputs M1~M15 of the four-to-fifteen bit converter 210 are used to control the turning-on and turning-off of the switches SWM1~SWM15. And, the outputs L1~L15 of the four-to-fifteen bit converter 220 are used to control the turning-on and turning-off of switches SWL1~SWL15.

The arrangement of the current source cells CSL1~CSL15 corresponding to LSBs and the arrangement of the current source cells CSM1~CSM15 corresponding to MSBs in the above-described configuration can be seen with reference to FIG. 3. The current source cells for LSBs and MSBs comprise 255 MOS transistors in an array. The array is formed by 16 columns and 16 rows. Each of all transistors is labeled with Tij where i and j represent the column number and the row number, respectively.

In the DAC with thermometer-codes to control the outputs from the current sources, the difference of the current source cells controlled by one thermometer-code and another is one cell only. Thus transient glitch can be reduced, but the size required by the current source cells is bigger, and the control circuit is very complicated.

To reduce the size of required current source cells and the complexity of the control circuit, those skilled in the art presented a segment-type DAC combining thermometer-code and binary-weighted to control the outputs of the current sources. The configuration thereof is schematically shown in FIG. 4. Assuming the segment-type DAC is capable of converting N-bits digital signal, then the M-bits, i.e. M MSBs, of N-bits signals are encoded to thermometer codes. That is, the M MSBs are encoded into $2^M-1$ thermometer-codes by a binary-to-thermometer encoder 410, then sent to the thermometer-code DAC 420. The rest of (N-M) LSBs pass through a delay device 430, and are directly sent to a binary-weighted DAC 440. Considering the die size and overall conversion, the segment-type DAC with a configuration combining thermometer-code and binary-weighted seems to be the best option available. But this configuration still has a match problem among the current source cells.

In the most ideal situation, the DAC should have linearly increasing analog output value along with the increasing value of the input-code. Nevertheless, it is apparent to those skilled in the art that in terms of the output from the DAC, the non-linearity problem still remains. In particular, as binary values are converted to thermometer-codes, the differential non-linearity (DNL) error still remains.

SUMMARY OF THE INVENTION

It is an object of the present invention to provide a digital-to-analog converter (DAC) which provides two different bias voltages to the most significant bit (MSB) portion and the least significant bit (LSB) portion. These two bias voltages can be adjusted according to the match among the current source cells.

Another object of the present invention is to provide a digital-to-analog converter (DAC) which provides two different bias voltages to the most significant bit (MSB) portion and the least significant bit (LSB) portion. The two bias voltages are proportional, and can be synchronously adjusted according to the match among the current source cells.

In an embodiment, the present invention is suitable for a segment-type DAC combining thermometer-code and binary-weighted configuration. The segment-type DAC provides two different bias voltages to the thermometer-code portion for the MSBs and the binary-weighted portion for the LSBs. And, the two bias voltages can be adjusted according to the match among the current source cells.

In an embodiment, the present invention is suitable for a segment-type DAC combining thermometer-code and binary-weighted configuration. The segment-type DAC provides two different bias voltages to the thermometer-code portion for the MSBs and the binary-weighted portion for the LSBs. And, the two bias voltages are proportional, and the two bias voltages can be synchronously adjusted according to the match among the current source cells.

In an embodiment, the present invention is suitable for a thermometer-code DAC which provides two different bias voltages to the MSB portion and the LSB portion. And, the two bias voltages can be adjusted according to the match among the current source cells.

In an embodiment, the present invention is suitable for a thermometer-code DAC which provides two different bias voltages to the MSB portion and the LSB portion. And, the two bias voltages are proportional, and the two bias voltages can be synchronously adjusted according to the match among the current source cells.

In an embodiment, the present invention is suitable for a binary-weighted DAC which provides two different bias voltages to the MSB portion and the LSB portion. And, the two bias voltages can be adjusted according to the match among the current source cells.

In an embodiment, the present invention is suitable for a binary-weighted DAC which provides two different bias voltages to the MSB portion and the LSB portion. And, the two bias voltages are proportional, and the two bias voltages can be synchronously adjusted according to the match among the current source cells.

To achieve the above-described objects, the present invention provides a DAC suitable for a segment-type configuration combining thermometer-code portion and binary-weighted portion. Therewith, a MSB portion of an input-code is thermometer-encoded to generate multiple corresponding thermometer codes. And therewith, a LSB portion of an input-code is binary-weighted to generate a plurality of binary-weighted codes. The DAC comprises a plurality of current source cells to provide currents. Wherein, a first portion of the current source cells receives a first bias voltage, and provides a current corresponding to the above-mentioned thermometer-code. A second portion of the current source cells receives a second bias voltage, and provides a current corresponding to the above-mentioned binary-weighted code. The first bias voltage and the second bias voltage would be adjusted according to match among the current resource cells, and remain a certain proportion.

In an embodiment, the above-described DAC further comprises a bias converter for receiving the first bias voltage, and adjusting the second bias voltage according to the match among the current resource cells.

In another embodiment, the above-described DAC further comprises a bias converter for receiving the second bias voltage, and adjusting the first bias voltage according to the match among the current resource cells.

In an embodiment, the above-described bias converter comprises a first transistor. And a gate thereof is coupled to the first bias voltage, a drain/source thereof is connected to an operation voltage, and another drain/source thereof is connected to a resistor element. Another end of the resistor element is connected to a current mirror circuit. The above-described bias converter further comprises a second transistor. A drain/source thereof is connected to said operation voltage, another drain/source thereof is connected to a gate thereof and connected to the current mirror circuit. And the second bias voltage just applies to the gate of the second transistor. According to the received first bias voltage, the second bias voltage is adjusted by the current mirror circuit and the resistor element.

In an embodiment, the above-described current mirror circuit comprises a third transistor. Wherein, a gate thereof is coupled to a drain/source thereof and connected to the resistor element, and another drain/source is grounded. The current mirror circuit further comprises a fourth transistor. Wherein, a gate thereof is connected to the gate of the third transistor, a drain/source thereof is connected to another drain/source of the second transistor and to the gate of the second transistor, and another drain/source is grounded.

In an embodiment, the above-described first transistor and second transistor have the same size, and the quantity thereof is equal to that of the current source cells in the first portion. These transistors are used for improving the device mismatch.

In an embodiment, the above-described resistor element is designed for compensating the channel length modulation of the DAC.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

The present invention provides a segment-type digital-to-analog converter (DAC) which provides two different bias voltages to the thermometer-code portion of the most significant bits (MSBs) and the binary-weighted portion of the least significant bits (LSBs). These two bias voltages can be adjusted according to the match among the current source cells. In addition, the two bias voltages are proportional, and the two bias voltages can be synchronously adjusted according to the match among the current source cells.

Figure 5:
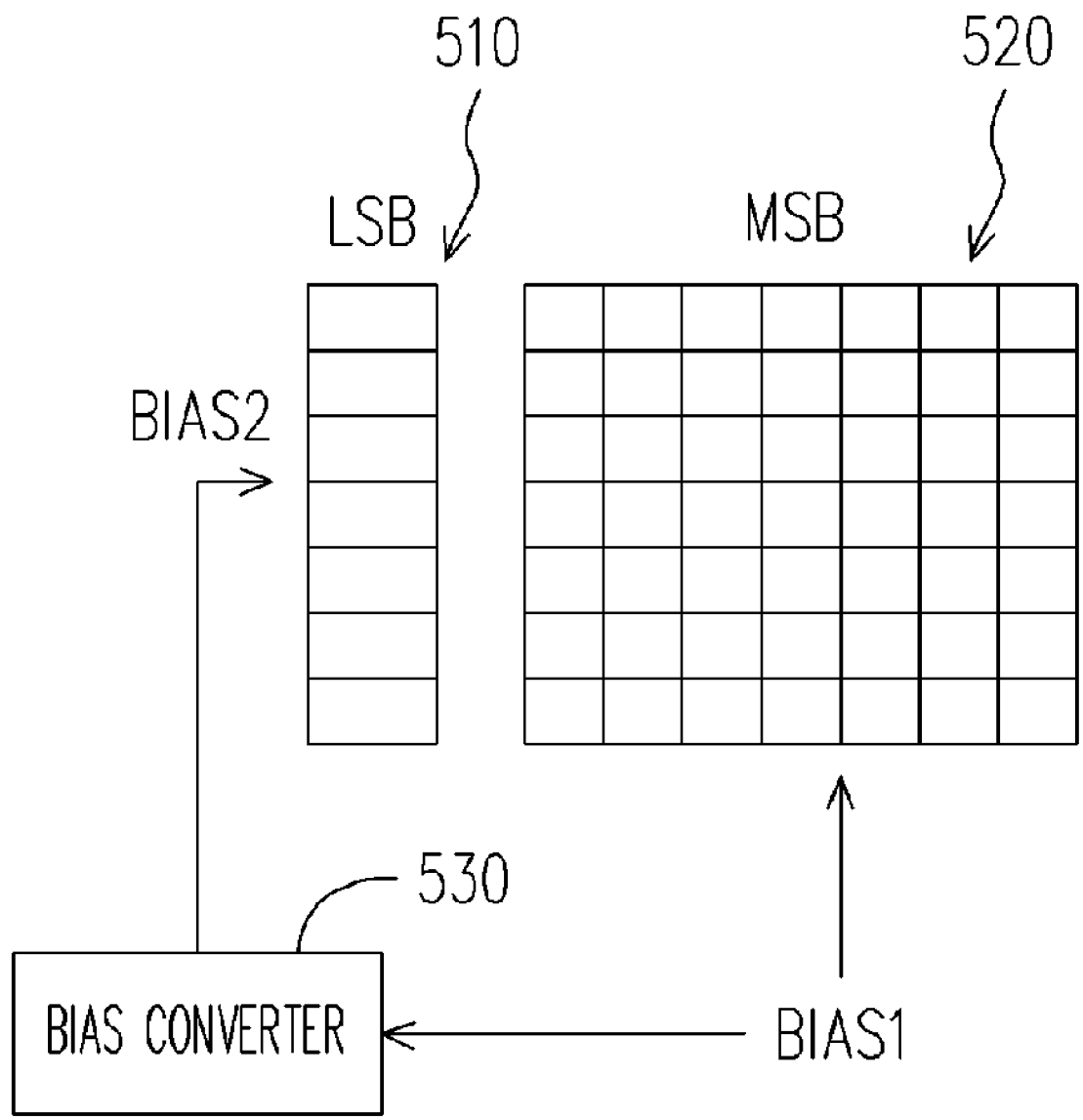
FIG. 5 is a schematic diagram illustrating a first bias voltage provided to the thermometer-code portion of the MSBs and a second bias voltage provided to the binary-weighted portion of the LSBs through a bias converter circuit according to an embodiment of the present invention.

If a first bias voltage is, for example, provided to the thermometer-code portion of the MSBs, then a second bias voltage is provided to the binary-weighted portion of the LSBs. The second bias voltage is obtained by converting the first bias voltage using a bias converter. The configuration thereof is shown in FIG. 5. Referring to FIG. 5, the second bias voltage BIAS2 is provided to the binary-weighted portion of the LSBs 510 and the first bias voltage BIAS1 is provided to the thermometer-code portion of the MSBs 520. And, the second bias voltage BIAS2 is obtained by converting the first bias voltage BIAS1 using a bias converter 530.

On the other hand, in an alternative embodiment, the first bias voltage can be obtained by converting the second bias voltage as well.

Figure 6:
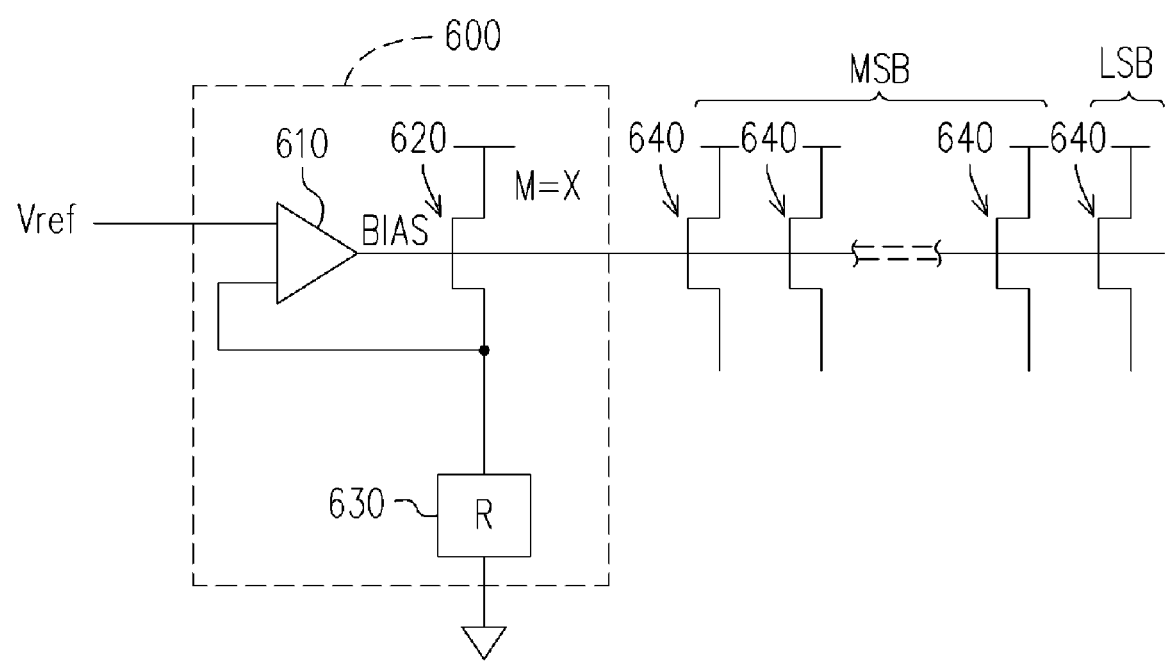
FIG. 6 is a schematic drawing of a bias generating circuit of the current source cells in a DAC.

Referring to FIG. 6, a schematic drawing of a bias generating circuit of current source cells in a DAC is shown. The bias voltage thereof is produced by a bias generating circuit 600. The bias generating circuit 600 comprises an operation amplifier 610, a transistor 620 and a resistor 630. The produced current thereof is Vref/r, and the unit current thereof is Vref/(r*X), where r is resistance of the resistor 630, and X is magnification multiple of the transistor 620. If only the all transistors 640 of the current source cells in the thermometer-code portion of MSBs and the current source cells in the binary-weighted portion of LSBs are the same size and the same type, for example, P-type metal oxide semiconductor (PMOS), then, a controlled PMOS quantity is used to give weighting result, consequently control the output current. For example, if a 10-bit DAC is a binary-weighted DAC, the weight for each bit is 512, 256, 128, 64, 32, 16, 8, 4, 2 and 1, respectively. If a 10-bit DAC is a DAC combining thermometer-code and binary-weighted, the thermometer-code portion is 64*15, and the binary-weighted portion is 32, 16, 8, 4, 2 and 1.

Figure 7:
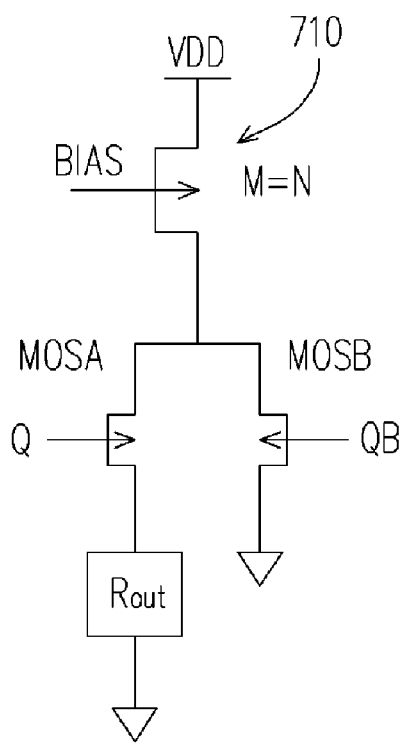
FIG. 7 is a schematic circuit drawing of a full current source cell in a DAC.

A schematic circuit drawing of a full current source cell in a DAC is shown in FIG. 7. Wherein, a switch MOS transistor 710 is included. The gate thereof is connected to the bias voltage BIAS, a drain/source thereof is connected to the operation voltage VDD, another drain/source thereof is connected to the transistors MOSA and MOSB, and the transistors MOSA and MOSB are controlled by the control signal Q and QB, respectively. Another end of MOS transistor MOSA is grounded via a resistor element Rout. Another end of MOS transistor MOSB is directly grounded. When this transistor is selected to produce current, the control signal Q takes a logic-low level, and the control signal QB takes a logic-high level. When the quantity of the current source varies, the sizes of the switch MOS transistor 710, the transistor MOSA and MOSB will accordingly be changed. For example, for a 10-bit DAC, the thermometer-codes thereof and the binary weights thereof are 64*15 and (32, 16, 8, 4, 2, 1), respectively.

Figure 1A:
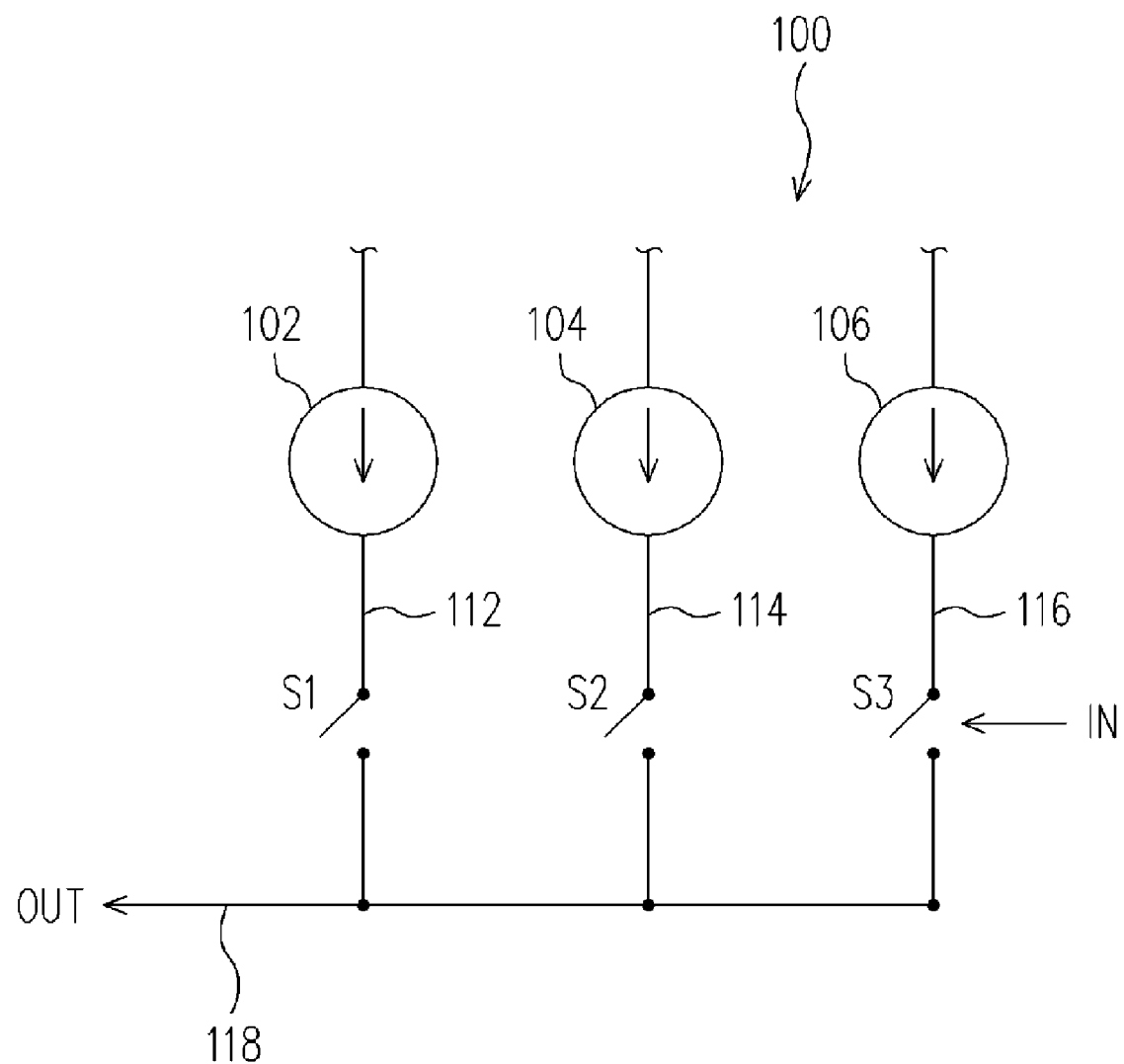
FIG. 1A is a schematic circuit drawing of a conventional binary-weighted DAC.
Figure 1B:
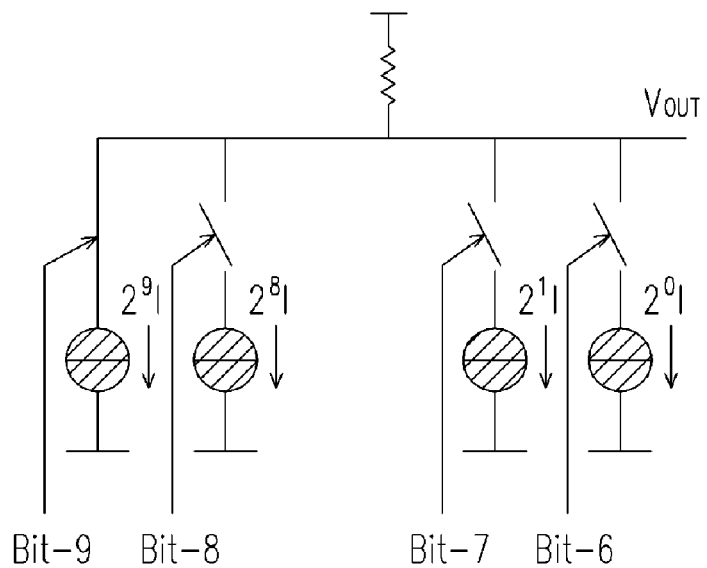
FIG. 1B is a schematic coordination diagram showing the relationship between input-codes and differential non-linearity (DNL) errors.
Figure 1B:
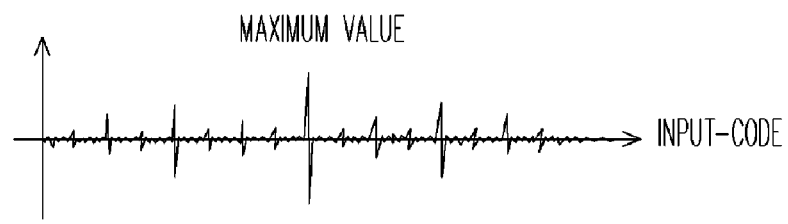
Figure 1C:
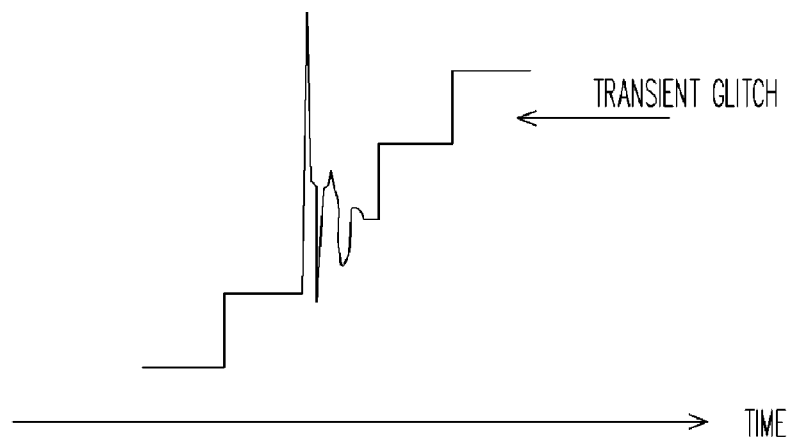
FIG. 1C is a schematic diagram showing the generation of an unpredictable transient glitch in the data transforming process.
Figure 2:
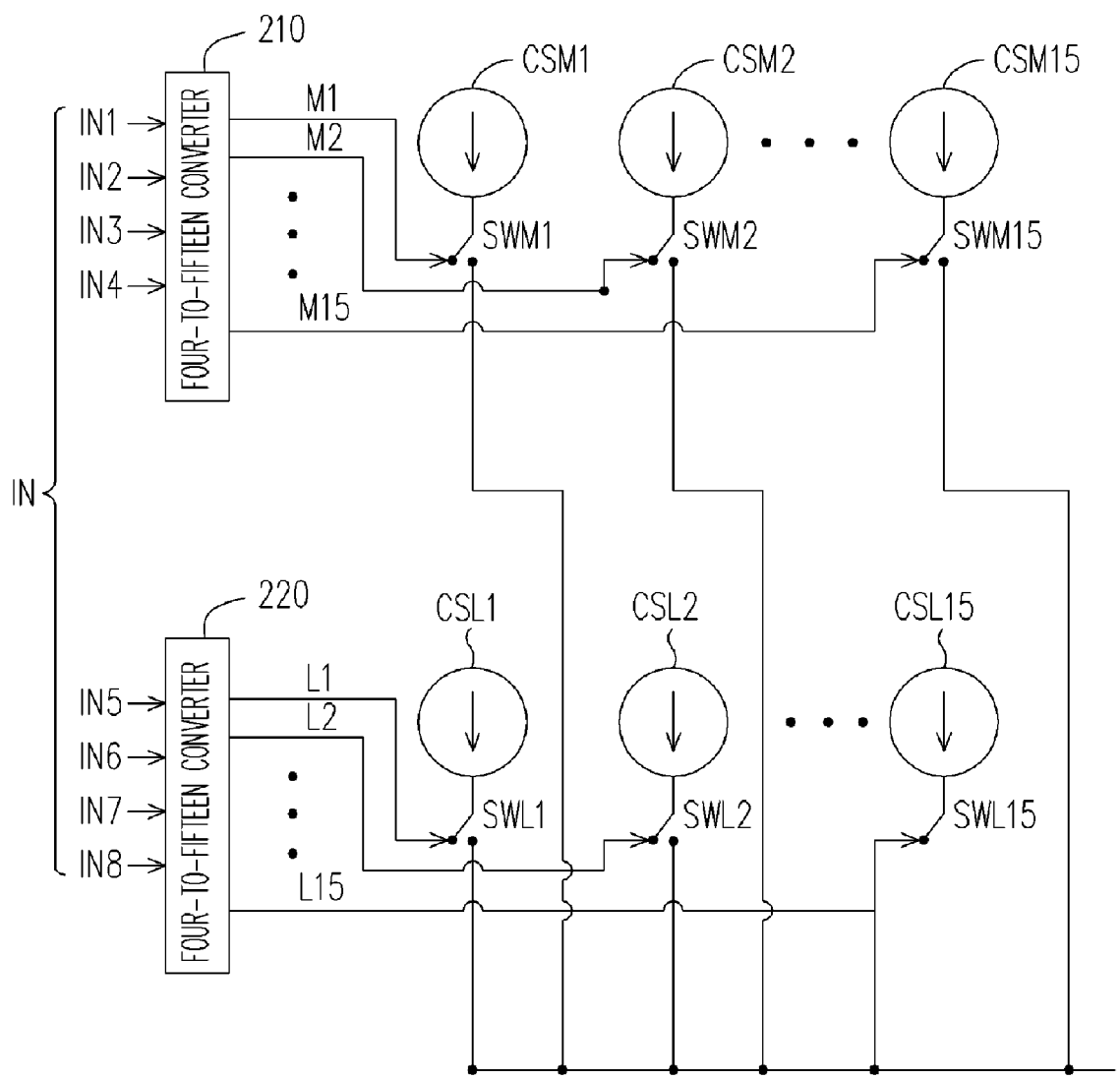
FIG. 2 is a schematic circuit drawing of a conventional 8-bit DAC with thermometer-codes.
Figure 3:
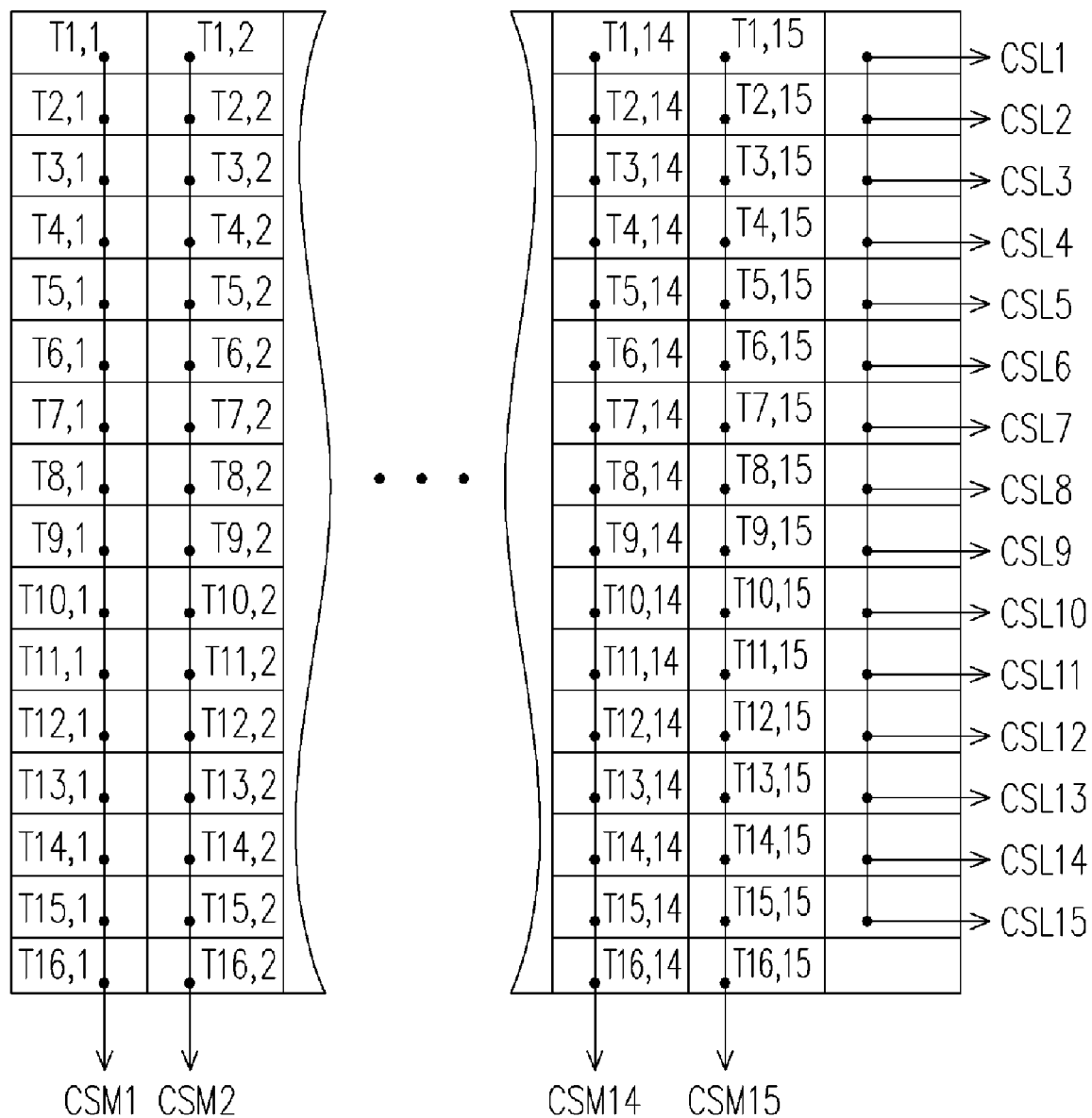
FIG. 3 is a schematic diagram showing an arrangement of current source cells for LSBs and MSBs.
Figure 4:
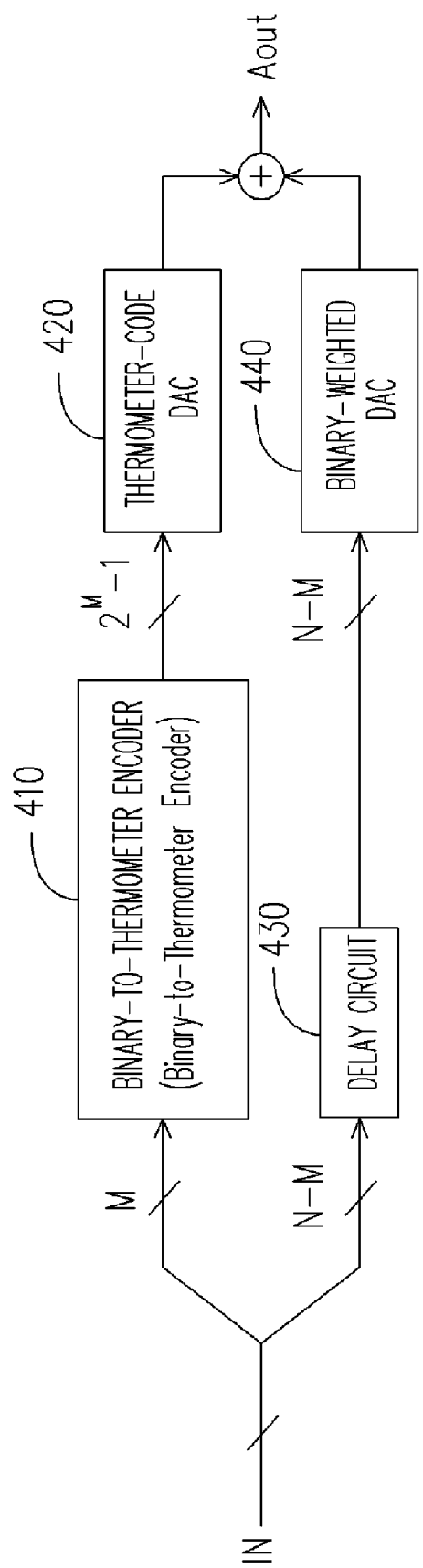
FIG. 4 is a schematic block diagram of a segment-type DAC circuit combining thermometer-code and binary-weighted configuration.

The configuration of the current source cells is shown in FIG. 3. If the total current produced by all current source cells in the LSB portion is not 63, the linearity of DAC would be ruined; that is, the above-described differential non-linearity (DNL) error occurs, or even a serious non-monotonic problem. With the non-monotonic problem, some output analog values corresponding to smaller digital input-codes IN are larger than those corresponding to larger digital input-codes, leading to serious error.

Figure 8:
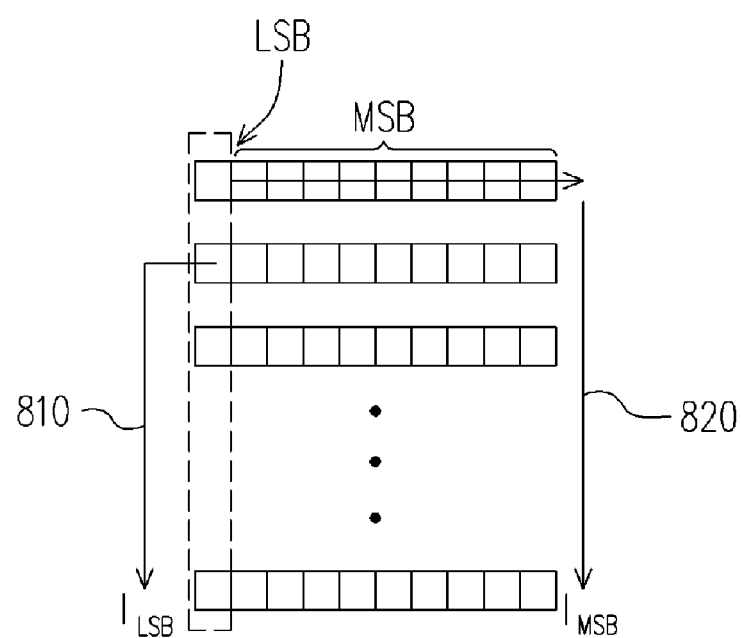
FIG. 8 is a schematic diagram showing a configuration of current source cells in a DAC.

The DNL error and/or the non-monotonic problem could be a matter of device mismatch; that is, the characteristic discrepancy among the formed transistors in the array of current source cells for LSB and MSB. And, the characteristic discrepancy among the formed transistors generally can be traced back to the inconsistency in semiconductor manufacturing process, such as inconsistent thickness of oxide layer, poor poly-silicon etching, or shift in ion implant, and so on. To avoid the discrepancy among the components, appropriate configurations must be applied. The U.S. Pat. No. 5,568,145, for example, provides a solution where the current source cells of LSB are arranged between two portions of the current source cells of MSB. But the discrepancy still remains. The other cause for the problem is layout limitation. To reduce the chip size, the adopted layout is very limited, and the lines between components are also limited, and thus the discrepancy problem. FIG. 8 is a schematic diagram showing a configuration of current source cells. Wherein, the dotted-line portion shows the arrangement of the current resource cells of LSB, and the remaining portion shows the arrangement of the current resource cells of MSB. The left arrow 810 indicates the path of output current Ilsb from the current source cell in the LSB portion, and the right arrow 820 indicates the path of output current Imsb from the current source cell in the MSB portion. Apparently, the serial resistor for the output current from the current source cells in the MSB portion is larger due to a longer distance. In general, the outside lines, i.e., the bottom portion indicated by the arrow 820, can be adjusted, or compensated. However, the appropriate compensation amount is very hard to estimate and to adjust. Moreover, this may result in a bigger layout area and becomes a disadvantage. Another potential problem is the channel length modulation. A various output level (voltage) leads to a various operation voltage VDD, and a various, inconsistent unit current.

Figure 9:
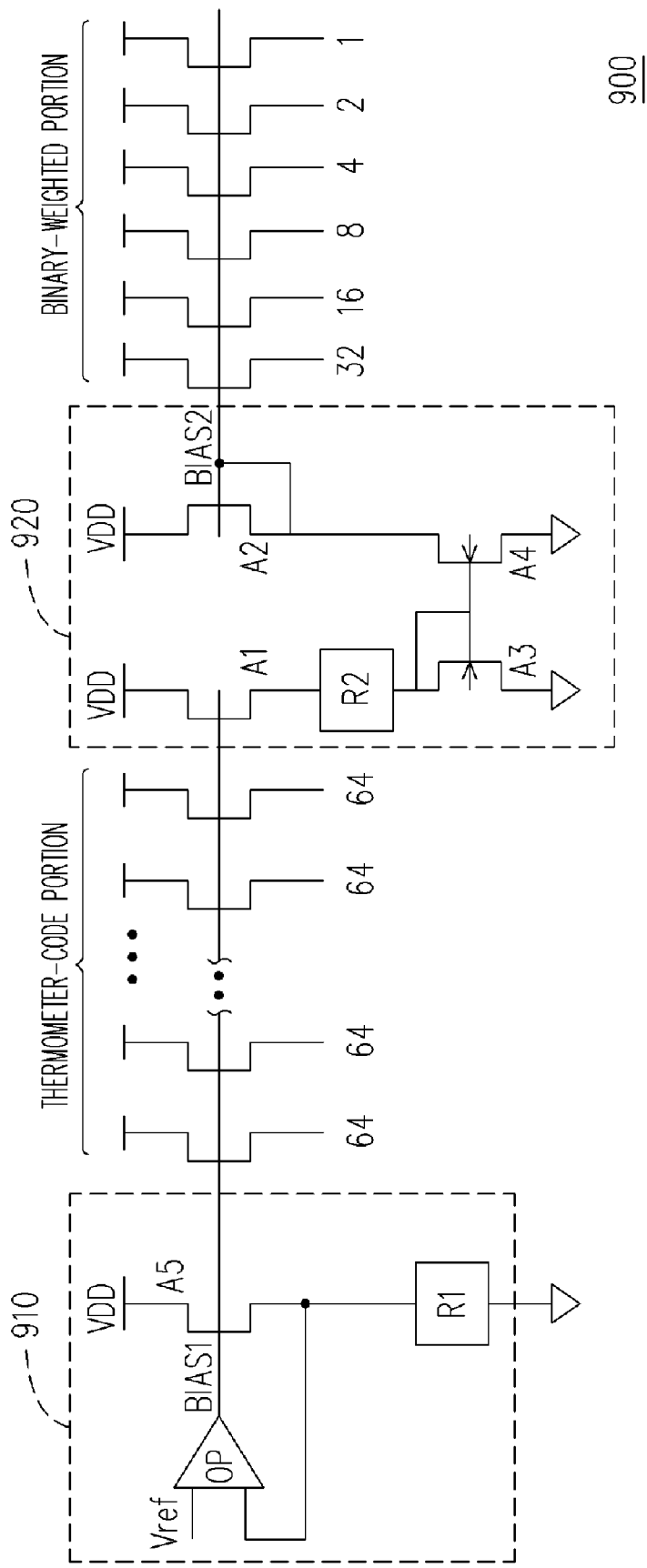
FIG. 9 is a schematic drawing of a segment-type DAC circuit combining thermometer-code and binary-weighted in an embodiment of the present invention.

Referring to FIG. 9, a schematic drawing of a segment-type DAC 900 combining thermometer-code and binary-weighted configuration is provided according to an embodiment of the present invention. The DAC 900 provides two different bias voltages to the thermometer-code portion of the most significant bits (MSBs) and the binary-weighted portion of the least significant bits (LSBs). These two bias voltages can be adjusted according to the match among the current source cells. In addition, the two bias voltages are proportional, and the two bias voltages can be synchronously adjusted according to the match among the current source cells. The DAC 900 is, for example but not limited to, a 10-bit DAC. That is, the present invention is suitable for all multi-bit segment-type DACs.

First of all, the bias generating circuit 910 of the DAC 900 comprises an operation amplifier OP, a transistor A5 and a resistor R1. One input end of the operation amplifier OP is connected to a reference voltage Vref. Another input end thereof is connected to the connecting point N1 of the transistor A5 and the resistor R1. The output from the operation amplifier OP, or a generated bias voltage is BIAS1, and is connected to the gate of the transistor A5. One drain/source of the transistor A5 is connected to an operation voltage VDD, and another drain/source thereof is grounded via the resistor R1. For each segment in the 10-bit DAC 900, the thermometer-code portion is 64*15, and the binary-weighted portion is 32, 16, 8, 4, 2 and 1. Thus, referring to FIG. 9, the arrangement of the current source cells in the DAC 900 is formed by the thermometer-code portion of MSBs and the binary-weighted portion of LSBs.

Assuming the total output current from the DAC 900 is 1 mini ampere (mA), and the required unit current is 1 μA. In the bias generating circuit 910 of the current source cells, the generated current thereof is Vref/r, and the unit current thereof is Vref/(r*X), where r is resistance of the resistor R1, and X is the magnification multiple of the transistor A5. Thus, when the reference voltage Vref is 1.2 volt (V), by using 10 as the magnification multiple in the transistor A5, and 120 kilo ohm (KΩ) as the resistance of R1, then the unit current is Vref/(r*X)=1.2/(120*10)=1 micro ampere (μA).

In the segment-type DAC 900 combining thermometer-code and binary-weighted in an embodiment of the present invention, each segment comprises a thermometer-code portion and a binary-weighted portion. A bias converter 920 is disposed between the above-mentioned two portions. The bias converter 920 is used to adjust another bias voltage BIAS2 for generating the binary-weighted portion according to both the bias voltage BIAS1 from the bias generating circuit 910 and the match among the current source cells. In addition, these two bias voltages BIAS1 and BIAS2 are proportional, and the two bias voltages can be synchronously adjusted according to the match among the current source cells. Any circuit capable of adjusting these two bias voltages is applicable to the present invention. For a clear description, only one embodiment is described as follows, but the present invention is not limited thereto. The schematic circuit drawing from the embodiment is shown in FIG. 9.

The bias converter 920 comprises a transistor A1, a transistor A2, transistors A3 and A4, and a resistor R2. The gate of the transistors A1 is coupled to the bias voltage BIAS1 generated by the bias generating circuit 910, a drain/source thereof is connected to an operation voltage VDD, and another drain/source thereof is connected to the resistor element R2. Another end of the resistor element R2 is connected to a current mirror circuit formed by the transistors A3 and A4. A drain/source of the transistor A2 is connected to an operation voltage VDD, and another drain/source thereof is connected to the gate thereof and connected to the current mirror circuit formed by the transistors A3 and A4. In an alternative embodiment, the resistor element is not required depending on the layout of the transistor A1, A2, A3 and A4.

If both the transistor A1 and A2 have the same size and the same quantity of 64 pieces, then the total sum in the binary-weighted portion is 63. And, both the transistor A3 and A4 in the current mirror circuit have the same quantity as well. The resistor element R2 is used for compensating the channel length modulation. In an embodiment, this resistance should be 32 times of the external resistor. Certainly, the compensation value can be adjusted according to the transistor A3 and the resistor R2.

Since the amount of the components in the thermometer-code segment is close to the amount of the transistor A1, and the both layouts are similar, the device mismatch is relatively reduced. But, in terms of the quantity and the arrangement of components, there is a big difference between the thermometer-code segment and the binary-weighted portion, leading to serious device mismatch. Referring to FIG. 9, by means of an appropriate disposition of the bias converter 920, the current match in both the thermometer-code segment portion and the binary-weighted portion can be improved. In particular, in the embodiment of the present invention, a current driving mode is used, not a conventional voltage compensation mode, so the improvement is more obvious. The transistors A1 in the bias converter 920 can be arranged in parallel to the components in the thermometer-code segment to increase the matching degree. In comparison, the transistor A2 in the bias converter 920 can be arranged with the components in the binary-weighted portion to be close to the average.

In the segment-type DAC 900 combining thermometer-code and binary-weighted of another embodiment of the present invention, each segment comprises a thermometer-code portion and a binary-weighted portion. A bias converter 920 is disposed between the above-mentioned two portions. The bias converter 920 can generate the bias voltage BIAS1 of the thermometer-code portion according to another bias voltage BIAS2 of the binary-weighted portion and the match among the current source cells. These two bias voltages BIAS1 and BIAS2 are proportional, and the two bias voltages can be synchronously adjusted according to the match among the current source cells.

Figure 10:
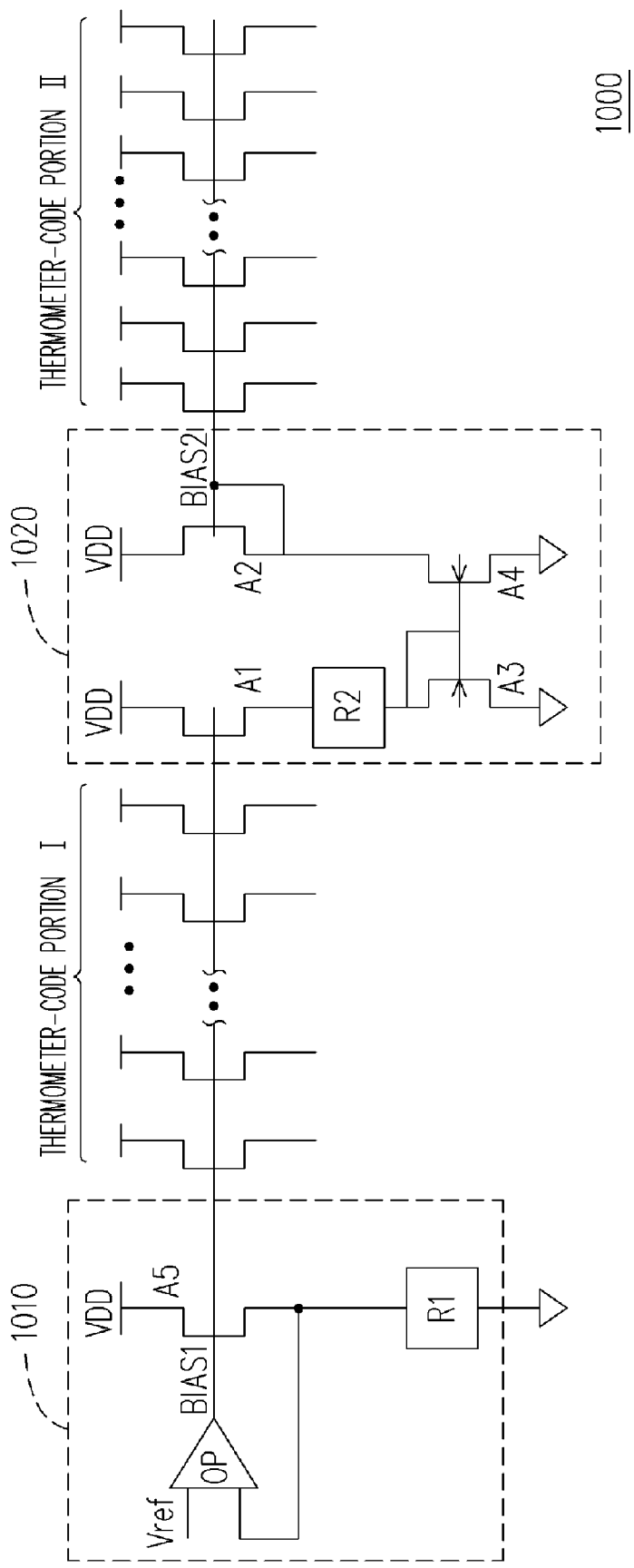
FIG. 10 is a schematic drawing of a thermometer-code DAC in an embodiment of the present invention.

In an alternative embodiment of the present invention, such design of the current driving mode to improve the match state is applicable in a thermometer-code DAC. As shown in FIG. 10, a schematic drawing of a thermometer-code DAC 1000 is shown. Wherein, a bias converter 1020 is disposed between two thermometer-code portions I and II. The thermometer-code portion I is coupled to the bias voltage BIAS 1 generated by the bias generating circuit 1010. The bias converter 1020 would adjust another bias voltage BIAS 2 of the thermometer-code portion II according to the bias voltage BIAS 1 generated by the bias generating circuit 1010 and the match among the current source cells. These two bias voltages BIAS1 and BIAS2 are proportional, and can be synchronously adjusted according to the match among the current source cells.

Figure 11:
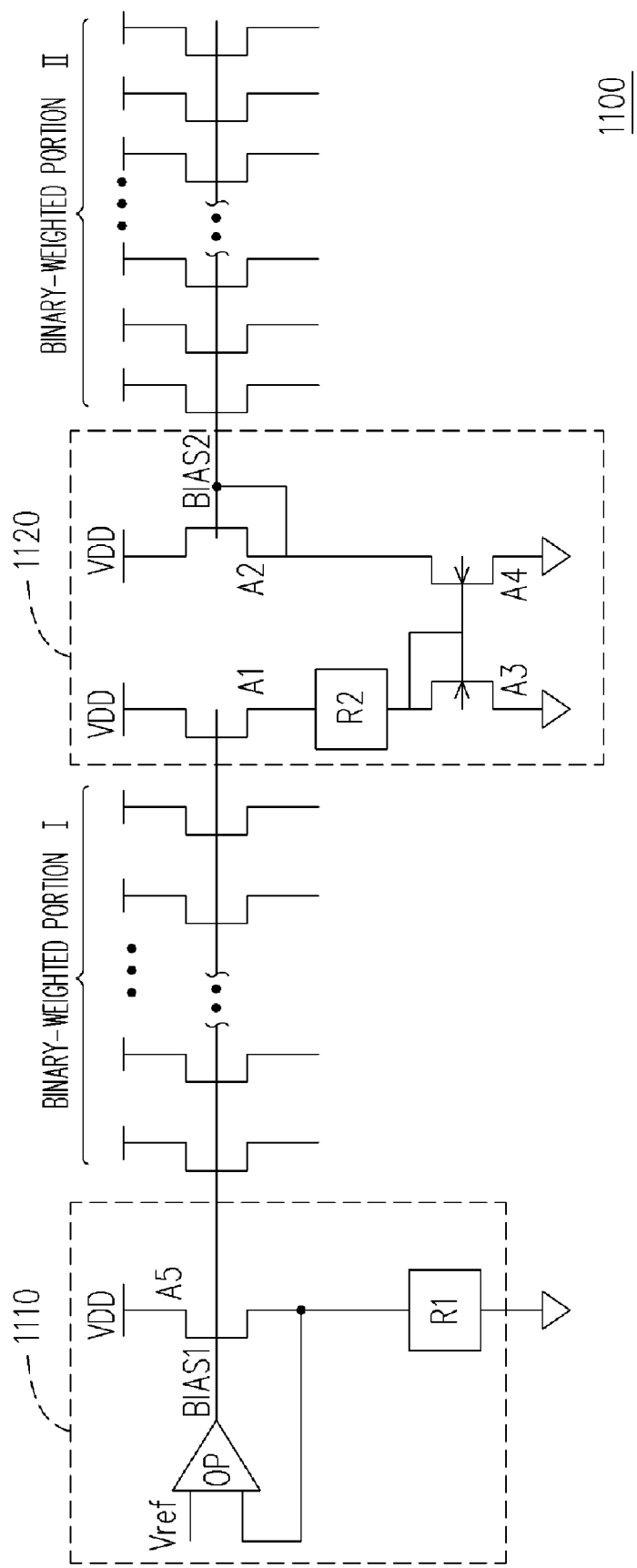
FIG. 11 is a schematic drawing of a binary-weighted DAC in an embodiment of the present invention.

In one alternative embodiment of the present invention, such design of the current driving mode to improve the match state is applicable in a thermometer-code DAC. As shown in FIG. 11, a schematic drawing of a binary-weighted DAC 1100 is shown. Wherein, a bias converter 1120 is disposed between two binary-weighted portions I and II. The binary-weighted portion I is coupled to the bias voltage BIAS 1 generated by the bias generating circuit 1110. The bias converter 1120 would adjust another bias voltage BIAS 2 of the binary-weighted portion II according to the bias voltage BIAS 1 generated by the bias generating circuit 1110 and the match among the current source cells. These two bias voltages BIAS1 and BIAS2 are proportional, and can be synchronously adjusted according to the match among the current source cells.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A digital-to-analog converter (DAC) suitable for a segment type combining a thermometer-code portion and a binary-weighted portion, used for thermometer-encoding a MSB portion of an input-code and generating multiple corresponding thermometer-codes, and binary-weighting a LSB portion of said input-code and generating a plurality of binary-weighted codes, wherein said DAC comprises:
   a plurality of current source cells for providing currents, wherein a first portion of said current source cells receives a first bias voltage and provides a current corresponding to said thermometer-codes, and a second portion of said current source cells receives a second bias voltage and provides a current corresponding to said binary-weighted codes, wherein said first bias voltage and said second bias voltage are adjusted according to the match among said current source cells, and keep a particular proportional relationship.

2. The DAC as recited in claim 1, wherein the DAC further comprises a bias converter for receiving said first bias voltage and adjusting said second bias voltage according to the match among said current source cells.

3. The DAC as recited in claim 1, wherein said bias converter comprises:
   a first transistor, wherein a gate thereof is coupled to said first bias voltage, a drain/source thereof is connected to an operation voltage, and another drain/source thereof is connected to a resistor element, and another end of said resistor element is connected to a current mirror circuit; and
   a second transistor, wherein a drain/source thereof is connected to said operation voltage, another drain/source thereof is connected to a gate thereof and to said current mirror circuit, and the gate of said second transistor is applied by said second bias voltage which can be adjusted by said current minor circuit and said resistor element according to received said first bias voltage.

4. The DAC as recited in claim 3, wherein said current mirror circuit comprises:
   a third transistor, wherein a gate thereof is coupled to a drain/source thereof and to said resistor element, and another drain/source is grounded; and
   a fourth transistor, wherein a gate thereof is connected to the gate of said third transistor, a drain/source thereof is connected to another drain/source of said second transistor and said gate of said second transistor, and another drain/source thereof is grounded.

5. The DAC as recited in claim 3, wherein said first transistor and said second transistor have the same size, and the quantity thereof is equal to the quantity of said current source cells in said first portion, to improve the device mismatch among the components.

6. The DAC as recited in claim 3, wherein the resistance of said resistor element is designed to compensate the channel length modulation in said DAC.

7. The DAC as recited in claim 6, wherein the resistance of said resistor element can be 32 times of an external resistor.

8. The DAC as recited in claim 1, wherein the DAC further comprises a bias converter for receiving said second bias voltage, and adjusting said first bias voltage according to the match among said current source cells.

9. The DAC as recited in claim 1, wherein said bias converter comprises:
   a first transistor, wherein a gate thereof is coupled to said first bias voltage, a drain/source thereof is connected to an operation voltage, another drain/source thereof is connected to a resistor element, and another end of said resistor element is connected to a current mirror circuit; and
   a second transistor, wherein a drain/source thereof is connected to said operation voltage, another drain/source thereof is connected to a gate thereof and to said current mirror circuit, the gate of said second transistor is applied by said second bias voltage, and said first bias voltage can be adjusted by said current mirror circuit and said resistor element according to the received said second bias voltage.

10. The DAC as recited in claim 9, wherein said current mirror circuit comprises:
   a third transistor, wherein a gate thereof is coupled to a drain/source thereof and to said resistor element, and another drain/source thereof is grounded; and
   a fourth transistor, wherein a gate thereof is connected to the gate of said third transistor, a drain/source thereof is connected to another drain/source of said second transistor and said gate of said second transistor, and another drain/source thereof is grounded.

11. The DAC as recited in claim 9, wherein said first transistor and said second transistor have the same size, and the quantity thereof is equal to the quantity of said current source cells in said first portion, to improve the device mismatch among the components.

12. The DAC as recited in claim 9, wherein the resistance of said resistor element is designed to compensate the channel length modulation in said DAC.

13. The DAC as recited in claim 12, wherein the resistance of said resistor element can be 32 times of an external resistor.

14. A DAC, comprising:
 a first set of current source cells which comprise a plurality of the first current source cells to receive a first bias voltage and to provide a current according to a first code;
 a second set of current source cells which comprise a plurality of the second current source cells to receive a second bias voltage and to provide a current according to a second code; and
 a bias converter, disposed between said first set of current source cells and the second set of current source cells, for adjusting both said first bias voltage and said second bias voltage and maintaining a particular proportional relationship therebetween according to the match between said first current source cells and said second current source cells.

15. The DAC as recited in claim 14, wherein said bias converter comprises:
 a first transistor, wherein a gate thereof is coupled to said first bias voltage, a drain/source thereof is connected to an operation voltage, another drain/source thereof is connected to a resistor element, and another end of said resistor element is connected to a current mirror circuit; and
 a second transistor, wherein a drain/source thereof is connected to said operation voltage, another drain/source thereof is connected to a gate thereof and to said current mirror circuit, the gate thereof is applied by said second bias voltage which can be adjusted by said current mirror circuit and said resistor element according to the received said first bias voltage.

16. The DAC as recited in claim 15, wherein said current mirror circuit comprises:
 a third transistor, wherein a gate thereof is coupled to a drain/source thereof and to said resistor element, and another drain/source thereof is grounded; and
 a fourth transistor, wherein a gate thereof is connected to the gate of said third transistor, a drain/source thereof is connected to another drain/source of said second transistor and said gate of said second transistor, and another drain/source thereof is grounded.

17. The DAC as recited in claim 16, wherein the resistance of said resistor element is designed to compensate the channel length modulation in said DAC.

18. The DAC as recited in claim 14, wherein said first code is a thermometer-code, and said second code is a binary-weighted code.

19. The DAC as recited in claim 14, wherein both said first code and said second code are thermometer-codes.

20. The DAC as recited in claim 14, wherein both said first code and said second code are binary-weighted codes.

* * * * *